United States Patent
Zajac et al.

(10) Patent No.: US 6,838,387 B1
(45) Date of Patent: Jan. 4, 2005

(54) FAST ETCHING SYSTEM AND PROCESS

(76) Inventors: John Zajac, P.O. Box 21237, San Jose, CA (US) 95151; Stephen Edward Savas, 13F, No. 12 Jiouhe 6th Street, Chungli, Taoyuan (TW)

( * ) Notice: Subject to any disclaimer, the term of this patent is extended or adjusted under 35 U.S.C. 154(b) by 102 days.

(21) Appl. No.: 09/886,654

(22) Filed: Jun. 21, 2001

(51) Int. Cl.[7] ............................................. H01L 21/302
(52) U.S. Cl. ........................................ 438/714; 438/719
(58) Field of Search ................................ 438/706, 710, 438/714, 719, 725, 716

(56) References Cited

U.S. PATENT DOCUMENTS

| | | | |
|---|---|---|---|
| 4,230,515 A | 10/1980 | Zajac | |
| 4,342,901 A | 8/1982 | Zajac | |
| 5,198,634 A | 3/1993 | Mattson et al. | |
| 5,212,116 A | * 5/1993 | Yu | 438/697 |
| 5,226,967 A | 7/1993 | Chen et al. | |
| 5,234,526 A | 8/1993 | Chen et al. | |
| 5,368,710 A | 11/1994 | Chen et al. | |
| 5,472,565 A | 12/1995 | Mundt | |
| 5,474,648 A | 12/1995 | Patrick et al. | |
| 5,581,874 A | * 12/1996 | Aoki et al. | 29/825 |
| 5,593,511 A | * 1/1997 | Foster et al. | 148/238 |
| 5,888,907 A | * 3/1999 | Tomoyasu et al. | 438/714 |
| 6,091,217 A | * 7/2000 | Parsadayan | 318/285 |
| 6,188,564 B1 | 2/2001 | Hao | |
| 6,239,403 B1 | 5/2001 | Dible et al. | |
| 6,257,168 B1 | 7/2001 | Ni et al. | |
| 6,303,045 B1 | 10/2001 | Bullock | |
| 6,451,157 B1 | * 9/2002 | Hubacek | 438/706 |

* cited by examiner

Primary Examiner—Kin-Chan Chen

(57) ABSTRACT

Plasma reactor and process for very fast etching of silicon or epoxy resins in which a wafer is placed on a pedestal in a chamber, gas is exhausted from the chamber through a pressure regulation valve, a gas containing fluorine and/or oxygen is introduced into chamber through a showerhead electrode which is positioned substantially parallel to and less than 6 mm from the pedestal, RF power is applied to the pedestal and/or the showerhead electrode, and the pressure inside the chamber is maintained at a level greater than 1.5 Torr.

2 Claims, 1 Drawing Sheet

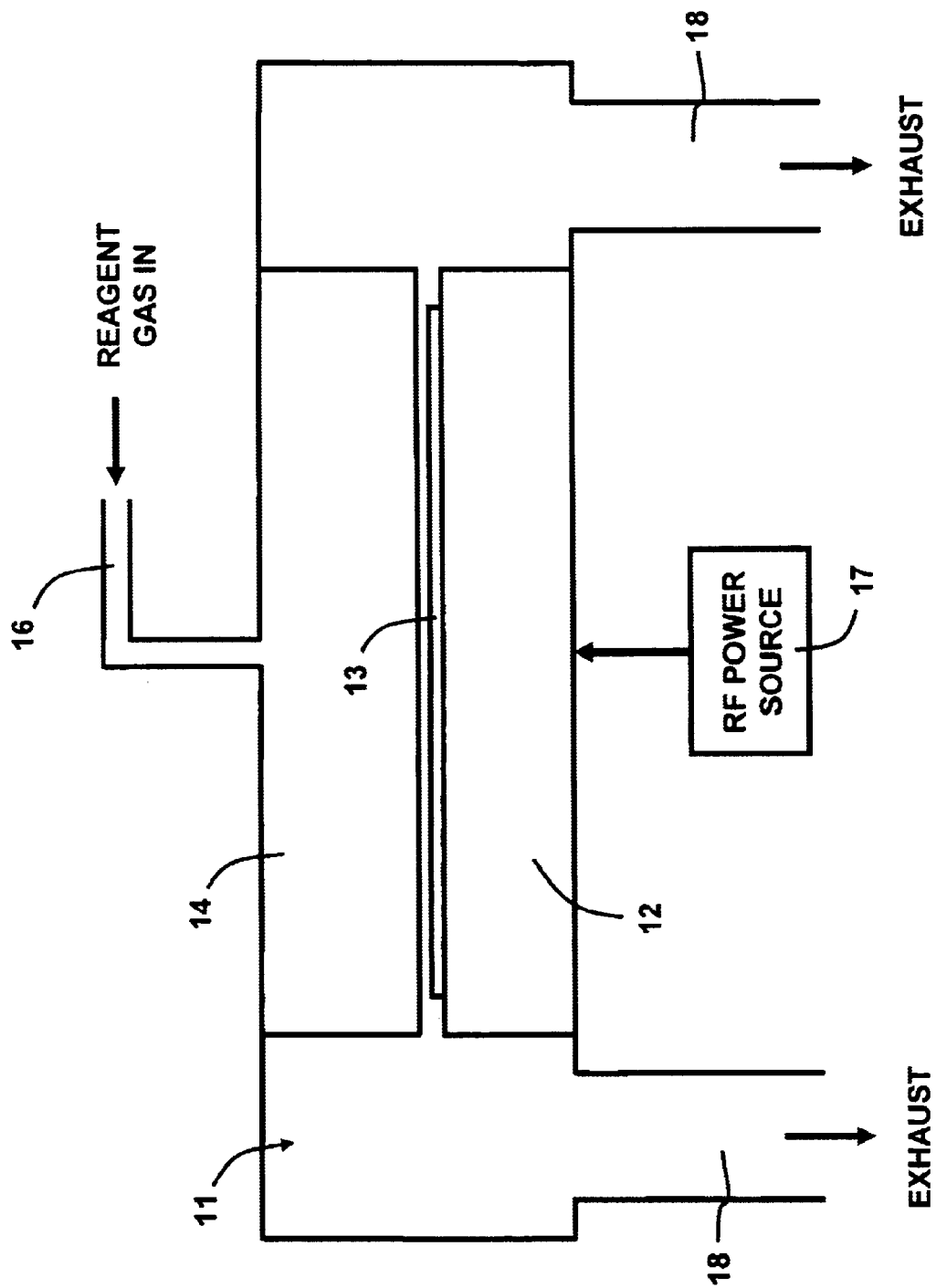

FAST ETCHING SYSTEM AND PROCESS

BACKGROUND OF THE INVENTION

1. Field of Invention

This invention pertains generally to etching and, more particularly, to a very fast etching system and process for use in the manufacture and backside etching of silicon wafers, integrated circuit packaging, and the manufacture of circuit boards.

2. Related Art

Historically, reactive ion etching, the prevalent method of plasma-based etching processes for integrated circuit (IC) manufacture, has used radio frequency electrical discharges between substantially parallel electrodes. The discharge produces ions and neutral reactive atoms and molecules that are responsible for the etching action. These etching processes were typically used in IC fabrication for silicon, silicon dioxide, silicon nitride or aluminum removal and used reactant gases containing fluorine or chlorine. Such processes have usually been anisotropic etching processes in which the material to be patterned was removed with the boundary being a plane substantially perpendicular to the wafer surface defined by a photolithographic mask. The typical removal rate of material for these processes was several thousand Angstroms per minute, adequate for the purposes of integrated circuit manufacture. The mask is made of photosensitive material—which is an organic polymer called photoresist. This etching process was called reactive ion etching (RIE) because it was the ions which provided the activation energy for the etching reactions, and the ions usually contained halogen atoms which formed volatile species upon reaction with the exposed material on the wafer. Under the conditions of the process, the ions from the plasma impact the wafer nearly perpendicular to the wafer surface activating reactions mostly on surfaces which are substantially parallel to the wafer surface and avoiding etching on surfaces which are perpendicular to the wafer surface.

The etching rate for these processes is adequate for the thin films used in IC fabrication which are usually no more than a few microns thick. (It is important that these etching processes not require too much time for completion in order that the cost of the processing not be excessive.) Typical system costs for such etching tools is about two to four million dollars. One reason for the high cost and low speed of such IC etching is that the structures to be etched on wafers are typically somewhat less than one micron in critical lateral dimension and therefore the process must be very clean. Other reasons for the high cost are that such processes must carefully control the angle of the sidewall produced by the etching and must strictly control the contaminant materials which are transferred to the surface during the etching process since very minute amounts will destroy the semiconductor's function.

The method of formation of a plasma for RIE is that radio frequency power is provided to the pedestal upon which the wafer is placed or the showerhead/upper electrode above the wafer. In addition to causing electrical breakdown and ionization of the gas it causes there to be a dc potential difference between the pedestal and the plasma which accelerates the positive ions to the wafer surface. The ions are thus given sufficient energy to promote the etching processes that is desired. The ions do this by activating the etching reactions of the halogen species with the exposed material on the wafer surface and also causing the reaction products to come off the surface either by sputtering or desorption. (J. W. Coburn and H. F. Winters, Plasma Etching—A discussion of mechanisms; Journal of Vacuum Science and Technology, Vol 16, page 391–403, 1979) One of the other reasons for the effectiveness of this technique was that if impurities which do not form volatile products built up on the surface, the ions from the plasma would sputter them off and thereby allow the etching to continue. Typical ion energies in this type of discharge are of order 100 eV to several hundred eV.

The typical gases tried for such etching processes of silicon or silicon-based insulators or alloys have included halogenated gases of many types. The typical current processes for etching silicon itself in IC fabrication have mainly included chlorine and bromine based gases. The reason is that the etching needs to be anisotropic and therefore there is a need for halogens which do not etch silicon unless ion impact promotes the necessary reactions. Sometimes, fluorocarbon gases may be used but they have a strong tendency to etch the silicon isotropically and undercut the patterning mask. On the other hand, isotropic etching processes for silicon, based on plasma sources, are usually done using fluorocarbons or nitrogen trifluoride as reactant gases. One reason for this is sulfur hexafluoride is generally considered less efficient than nitrogen trifluoride for producing such isotropic silicon etching and may leave sulfur containing residues. Etching of silicon with sulfur hexafluoride was tried in the early days of plasma etching by various researchers and found to be unexceptional in its properties, and was not adopted as principal halogenated gas for etching processes. (K. M. Eisele, Journal of the Electrochemical Society, Vol. 128, page 123–126, 1981; also W. Beinvogl, H. R. Deppe, R. Stokan and B. Hasler, I.E.E.E. Transactions on Electron Devices, Vol. ED-28, page 1332–1337, 1981; and Anisotropic etching of polysilicon using $SF_6$ and $CFCl_3$, M. Mieth and A. Barker, J. Vac. Sci. Technol. A1, 629–635, 1983) These researchers disclosed etching processes with rates well below one micron per minute typically with gas pressures of several hundred millitorr and power levels up to several watts per square centimeter.

The RIE process, however, has not been found suitable for some etching steps in semiconductor fabrication because of the energy of the ions which impact the wafer and the active electrical charging it causes on the surface of the wafer. Included among these are processes where sensitive areas of the mono-crystalline silicon are exposed and therefore there could be dislocations (resulting in impaired function) caused by the ion impact. Among such processes are those for etching organic contaminants left on the wafer after other patterning processes and in which no directionality of the etch is desired. Such processes are called isotropic. Mattson and Martin (U.S. Pat. No. 5,198,634) demonstrated the usefulness of a new regime for isotropic etching of organic polymers using the parallel plate discharge in which the gas pressure in the process chamber was much higher than in previous work. In their process the radio frequency power input was also limited in proportion to the pressure and the volume of the plasma (less than 0.15 Watts/Cm with the intent of reducing electrical and ion impact damage to the semiconductor devices located on the wafer surface. Their etching technique permitted a relatively high rate of removal of organic residues or other undesired material from the surface of a semiconductor wafer while not causing electrostatic charge-based damage to the sensitive transistors being fabricated on the wafer surface. The pressure for their process was so high (typically 20 Torr to 30 Torr) that the ions from the plasma make many collisions in moving to the wafer and only have a few eV of energy remaining when they impact the wafer. However, the Mattson processing system relies for its efficiency of etching (typically of organic material) on the use of higher wafer temperature (>150 C and usually about 250 C) to achieve their rate of etching. Their invention successfully achieves the goals of avoiding charging and ion damage while getting high removal rates for the organic photoresist—usually about two microns per minute. It also avoids, as required, sputtering the exposed materials of the semiconductor devices or interconnects on the wafer surface. This apparatus, however, is not capable of removing organic materials at high rates when the wafer temperature is low (<100° Celsius) nor can it achieve rapid etching of silicon or silicon-based materials. At temperatures below 100° Celsius the etching rate drops by at least an order of magnitude to about a few thousand Angstroms per minute. High rate etching of materials at low temperature requires a larger supply of chemically reactive species, such as oxygen or fluorine atoms than the Mattson device can supply, and an alternative source of activation energy to be provided for the desired etching reactions at the surface of the substrate. In RIE that energy is substantial and causes sputtering of materials and even crystalline damage to the silicon of the wafer. In other applications such ion bombardment would cause sputtering of some of the materials exposed on the workpiece which would cause problems for the finished product.

In applications where crystalline silicon is to be etched isotropically at high rates there have been reports of such processes succeeding without benefit of ion bombardment but these have used very high density plasma torches in which the gaseous species—particularly fluorine atoms—are at high temperatures. In such plasmas the heat transfer to the wafer by the gas is very considerable. In this case there is a requirement for very high speed scanning of the plasma across the substrate to avoid heating damage. (S. Savastiouk, O. Siniaguine and M. Hammond, Atmospheric Pressure Downstream Plasma—a new tool for semiconductor processing, Solid State Technology, June, 1998.) If such etching is to be done at modest temperatures as required for some applications the heating associated with this high pressure torch method needs to be avoided. Further, the high speed scanning and intense heat removal make reliability of such a processing system hard to achieve.

U.S. Pat. No. 5,198,634 describes a plasma reactor for contamination removal using a much lower ratio of power density to gas pressure. That system is not capable of the high rate etching needed under the temperature conditions which are required.

OBJECTS AND SUMMARY

It is in general an object of the invention to provide a new and improved etching system and process.

Another object of the invention is to provide a system and process of the above character which overcome the limitations and disadvantages of the prior art.

These and other objects are achieved in accordance with the invention by providing a plasma reactor and process for very fast etching of silicon or epoxy resins in which a wafer is placed on a pedestal in a chamber, gas is exhausted from the chamber through a pressure regulation valve, a gas containing fluorine and/or oxygen is introduced into chamber through a showerhead electrode which is positioned substantially parallel to and less than 6 mm from the pedestal, RF power is applied to the pedestal and/or the showerhead electrode, and the pressure inside the chamber is maintained at a level greater than 1.5 Torr.

BRIEF DESCRIPTION OF THE DRAWING

The single FIGURE of drawing is side elevational view, somewhat schematic, of one embodiment of an etching system incorporating the invention.

DETAILED DESCRIPTION

The invention relates to the use for etching of a capacitively coupled radio frequency plasma discharge between substantially parallel electrodes using feed gas(es), at least one which is halogen, oxygen or hydrogen containing. The etching process rapidly etches silicon or organic polymers or adhesives, or other materials which may be composites or mixtures of organic and silicon-containing materials. The etching may be for any of several applications and thus may be mainly isotropic (equally fast in all directions) or substantially anisotropic (etching vertically when the substrate plane is horizontal). Such applications may include silicon wafer thinning for flash card or smart card use. A second would be silicon wafer production in which silicon is etched. Another might be etching of deep holes or trenches in wafers for integrated circuit manufacture. The invention could also be used for etching in making optoelectronic devices, or microelectromechanical systems. The process could also be used for fabrication of magnetoelectric devices; for etching encapsulants used in packaging of integrated circuit chips (either in individual packages or on substrate boards); for cleaning or microvia formation for multichip modules or for substrates used in packaging microchips or printed circuit boards; or for other microdevice fabrication processes. The key to the economic value and usefulness of this etching process in the stated applications is the very high etching rate, which at a minimum exceeds two to three microns of etching depth per minute and may for some materials and applications attain several tens of microns per minute.

As illustrated in FIG. 1, the etching system includes a chamber 11 which contains a pedestal 12 on which a wafer 13 is placed. A showerhead electrode 14 is spaced above and parallel to the pedestal, and reagent gases are injected into the chamber through a gas line 16 connected to the showerhead electrode. An RF power source 17 supplies RF energy to the chamber to ionize the gas, and gas is pumped out of the chamber through exhaust ports 18.

Silicon Etching Process

The basic silicon etching process is done between electrodes which are spaced about 3 mm to 6 mm apart so as to concentrate the power on a small volume of gas. This makes the plasma density elevated and increases the etching rate. Reducing the gap between electrodes to this distance resulted in a stable and uniform electrical discharge between the electrodes at the desired process pressure with the desired process gas(es). When larger gaps were tried the plasma was not stable and caused uneven etching and unpredictable etching patterns on the silicon. This was found to be the case up to power densities of greater than 10 watts per square centimeter of electrode area.

The preferred gas mixture used for this process is a combination of sulfur hexafluoride and oxygen. Both of these gases are inexpensive and the mixture provided a great deal of fluorine atoms in the electrical discharge for the etching process to proceed at high rate. Nitrogen trifluoride was also tried but was found to cause degradation of surfaces in the reactor and not to give any higher etching rate than sulfur hexafluoride. It is not any better in this process as a source of fluorine and is enormously more expensive. Other oxidizing gases such as Nitrous oxide may also be used in the process but cause the cost of the process to increase.

Since large flows of these gases need to be used to provide for such high etching rates the cost of the gas is a significant factor in the cost of the process and inexpensive gases are essential for the commercial competitiveness of the processes. Typical flows of such gases required for the etching process range from a few hundred standard cubic centimeters per minute (sccm) to as much as three thousand sccm, both for the sulfur hexafluoride and for the oxygen or oxidizer. Other gases may be added to the process to slow the rate such as inert gases or methane or other hydrocarbon gases.

The preferred pressure for the silicon etching process is between 1.5 Torr and 10 Torr. The reason for the pressure having to be as high as this is to greatly reduce the energy of the ions which strike the substrate. High ion energy causes the sputtering of some of the exposed materials on the substrate such as metals, and can cause dislocations to be formed in the silicon crystal which degrade semiconductor function. Increasing the pressure increases the collisions that the ions make in the sheath regions of the plasma where the ions are accelerated by the potential difference between the electrode surface and the plasma. This potential difference can often be more than one hundred Volts or more and only if the ions make a number of collisions while being accelerated across this potential do they have energies which at a maximum are less than 20 eV per atom which is necessary to avoid sputtering. Higher pressures cause there to be more collisions of ions in the sheath which reduce ion energies. For silicon dislocations to be avoided when processing single crystal silicon wafers the energies of the ions which strike the surface should be less than or about 50 eV. At pressures less than 1.5 Torr the ion energies are likely to exceed this threshold for the type of plasma discharge needed to produce the high etching rates.

The preferred mode for the radio frequency power to be applied is by pulsing it with a duty cycle between 20% and about 60%. This reduces the heating of the substrate because the power of the plasma is only on the substrate during the on phase of the cycle. Some of these processes require that the wafer be kept below a certain temperature, that temperature usually being below 100° Celsius. However, the RF power density to plasma must be above a certain level in order to provide a stable discharge. Thus, the heating of the substrate may be reduced by pulsing the RF power, while not compromising the stability of the discharge or the uniformity of the etching.

The ratio of the RF power density (applied to the plasma while it is in the on phase of the duty cycle) to the total gas pressure needs to be at least 1.0 Watts per centimeter cubed per Torr of gas pressure. This is because below this level neither can the required etching rate be achieved, nor the plasma be made to operate in a stable way with the gas composition and pressure required for the high etching rate. Typically, above 25 Watts per centimeter cubed per Torr the heating of the substrate is unacceptably high. With a power density per pressure of between three and six Watts per centimeter cubed per Torr etching rates for the silicon of about seven to ten microns per minute are achieved.

Organic Etching Process

The basic organic materials etching process is done between electrodes which are spaced about 3 mm to 8 mm apart so as to concentrate the power on a small volume of gas. This makes the plasma density elevated and increases the etching rate. Furthermore, reducing the gap between electrodes to this distance resulted in a stable and uniform electrical discharge between the electrodes at the desired process pressure with the desired process gas(es). When larger gaps were tried the plasma was not stable and caused uneven etching and unpredictable etching patterns on the silicon. This was found to be the case up to power densities of greater than 10 watts per square centimeter of electrode area.

The preferred gas mixture used for this process is a combination of oxygen (or a strong oxidizer such as nitrous oxide) and a small percentage of sulfur hexafluoride or fluorocarbon gas. All of these gases are inexpensive and the mixture provides a great deal of oxygen atoms in the electrical discharge for the etching process to proceed at high rate. Other oxidizing gases such as Nitrous oxide may also be used in the process but cause the cost of the process to increase. Since large flows of these gases need to be used to provide for such high etching rates the cost of the gas is a significant factor in the cost of the process and inexpensive gases are essential for the commercial competitiveness of the processes. Typical flows of such gases required for the etching process range from a few hundred standard cubic centimeters per minute (sccm) to as much as three thousand sccm, both for the sulfur hexafluoride and for the oxygen or oxidizer. Other gases may be added to the process to slow the rate such as inert gases or methane or other hydrocarbon gases.

The preferred pressure for the organic etching process is between 2.0 Torr and 15 Torr. The reason for the pressure having to be as high as this is to greatly reduce the energy of the ions which strike the substrate. High ion energy causes the sputtering of some of the exposed materials on the substrate such as metals. Increasing the pressure increases the collisions that the ions make in the sheath regions of the plasma where the ions are accelerated by the potential difference between the electrode surface and the plasma. This potential difference can often be more than one hundred Volts or more and only if the ions make a number of collisions while being accelerated across this potential do they have energies which at a maximum are less than 20 eV per atom which is necessary to avoid sputtering. Higher pressures cause there to be more collisions of ions in the sheath which reduce ion energies. At pressures less than 2.0 Torr the ion energies are likely to exceed this threshold for the type of plasma discharge needed to produce the high etching rates.

The preferred mode for the radio frequency power to be applied is by pulsing it with a duty cycle between 20% and about 60%. This reduces the heating of the substrate because the power of the plasma is only on the substrate during the on phase of the cycle. Some of these processes require that the wafer be kept below a certain temperature, that temperature usually being below 80° Celsius. However, the RF power density to plasma must be above a certain level in order to provide a stable discharge. Thus, the heating of the substrate may be reduced by pulsing the RF power, while not compromising the stability of the discharge or the uniformity of the etching.

The ratio of the RF power density (applied to the plasma while it is in the on phase of the duty cycle) to the total gas pressure needs to be at least 0.6 Watts per centimeter cubed per Torr of gas pressure. This is because below this level neither can the required etching rate be achieved, nor the plasma be made to operate in a stable way with the gas composition and pressure required for the high etching rate. Typically, above 20 Watts per centimeter cubed per Torr the heating of the substrate is unacceptably high. With a power density per pressure of between one and two Watts per centimeter cubed per Torr, etching rates for epoxy or other organic adhesives of about seven to ten microns per minute are achieved.

The invention differs from processes commonly used for etching in integrated circuit manufacture in the type of material to be etched and the application, the physical gap between the electrodes, the total gas pressure in the process chamber, the power density and the duty cycle of the radio frequency power applied to the electrodes, the mixture of gases (which depends on the material to be etched), and the etching rate that is achieved.

The applications for which the invention is particularly suitable include etching of the back side of a silicon wafer after integrated circuit manufacture is completed. This etching process must be very high in rate to be economical and typically must be consistent with the wafer being kept at temperatures below 100° Celsius. This is a substantially isotropic etching process.

The invention is also useful in the etching of silicon from the silicon slices which are to be made into silicon wafers which will later be used for integrated circuit manufacture. This is a substantially isotropic etching process. It can also be used in the etching of silicon for the manufacture of microelectromechanical systems when such processes are of the isotropic etching types, and in the etching of deep vias (typically round holes which are much deeper than wide) in silicon wafers after integrated circuits have been made on the wafer when such etching is of the isotropic type. These vias may be used for electrically connecting the chip to the chips which may be mounted directly below it.

For etching silicon, the physical distance (gap) between the upper electrode and the substrate surface this needs to be between 3 millimeters and 6 millimeters. This is an unusually small distance and is appropriate for concentrating the power of the discharge in as small as possible a volume of gas. This causes the density of the plasma to be increased and the efficiency of dissociation of the molecular feed gases to be maximized.

For etching of organic materials this gap needs to be between 3 mm and approximately 8 mm. This permits the electrical power to be concentrated in a small volume of gas with resulting high plasma density and high dissociation rate for the oxygen containing gas and the other gaseous additives.

For silicon etching processes, the total gas pressure may be between 1.5 Torr and 10 Torr. For organic materials etching processes the total gas pressure may be between 2 Torr and 20 Torr.

For silicon etching the ratio of the radio frequency power density to the total gas pressure in the process chamber may range from one watt per cubic centimeter per Torr of gas pressure to as much as twenty five watts per cubic centimeter per Torr. The duty cycle may be between 5% and 100%. The preferred range would be between 10% and 50%

For etching organic materials, the ratio of the RF power density to the total gas pressure in the process chamber may range from 0.6 Watts per cubic centimeter per Torr to as much as 15 Watts per cubic centimeter per Torr. The duty cycle may be between 10% and 100% with the preferred range between 10% and 80%.

These processes may utilize a gas mixture which the dominant constituents are a fluorine containing gas such as $SF_6$ or $NF_3$, and oxygen or a strong oxidizing gas such as $N_2O$.

In the process of the invention, the radio frequency power density is substantially higher than in the process described U.S. Pat. No. 5,198,634. This process is typically carried out at pressures of about four to ten Torr to as much as ten Torr, and utilizes amounts of power in excess of a kilowatt for an 8" diameter processing area.

For many of the applications for which this process is used, the workpiece to be etched (either a wafer or some other substrate) must be kept below a certain temperature in order to avoid undesirable effects. In many instances the required limiting temperature is less than 100° Celsius.

It is apparent from the foregoing that a new and improved etching system and process have been provided. While only certain presently preferred embodiments have been described in detail, as will be apparent to those familiar with the art, certain changes and modifications can be made without departing from the scope of the invention as defined by the following claims.

What is claimed is:

1. A process for very fast etching of silicon or epoxy resins, comprising the steps of:

placing a wafer on a pedestal in a chamber;

exhausting gas from the chamber through a pressure regulation valve;

introducing a gas containing fluorine and/or oxygen into chamber through a showerhead electrode which is positioned substantially parallel to and less than 6 mm from the pedestal;

applying RF power to the pedestal and/or the showerhead electrode; and maintaining the pressure inside the chamber at a level greater than 1.5 Torr.

2. The process of claim 1 wherein the ratio of the RF power provided between the showerhead electrode and the pedestal to the gas pressure is greater than 1 Watt per cubic centimeter to each Torr of gas pressure.

* * * * *